(12) United States Patent
Candelier et al.

(10) Patent No.: US 7,289,355 B2
(45) Date of Patent: Oct. 30, 2007

(54) PRE-WRITTEN VOLATILE MEMORY CELL

(75) Inventors: Philippe Candelier, St-Mury-Monteymond (FR); Jean Lasseuguette, Grenoble (FR); Richard Fournel, Lubin (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 11/261,396

(22) Filed: Oct. 25, 2005

(65) Prior Publication Data

US 2006/0139990 A1   Jun. 29, 2006

(30) Foreign Application Priority Data

Oct. 25, 2004   (FR) .................................. 04 11360

(51) Int. Cl.
*G11C 11/00* (2006.01)
(52) U.S. Cl. ...................................... 365/154; 365/226
(58) Field of Classification Search ................ 365/154, 365/226
See application file for complete search history.

(56) References Cited

U.S. PATENT DOCUMENTS

| | | | | |
|---|---|---|---|---|
| 4,821,233 A | * | 4/1989 | Hsieh | ........................ 365/203 |
| 5,239,510 A | * | 8/1993 | Hill | ............................. 365/226 |
| 6,750,555 B2 | * | 6/2004 | Satomi et al. | .............. 365/154 |
| 6,862,227 B2 | * | 3/2005 | Yamaoka et al. | ...... 365/189.09 |
| 2003/0218218 A1 | * | 11/2003 | Chaudhry et al. | .......... 257/391 |

FOREIGN PATENT DOCUMENTS

| | | |
|---|---|---|
| EP | 0460691 | 12/1991 |
| EP | 1434237 | 6/2004 |
| JP | 63081974 | 4/1988 |

OTHER PUBLICATIONS

Rabaey, Jan M. "Digital Integrated Circuits: a design persepctive" 1996, Prentice Hall Electronics and VLSI Series, XP002366019, pp. 126-127.

* cited by examiner

*Primary Examiner*—Hoai V. Ho
(74) *Attorney, Agent, or Firm*—Lisa K. Jorgenson; Jon A. Gibbons; Fleit Kain Gibbons Gutman Bongini & Bianco P.L.

(57) ABSTRACT

A memory cell of the SRAM type is provided that is capable of storing one datum in a non-volatile manner. The memory cell includes two inverters (20 and 21) configured as a flip-flop for storing one bit. Each inverter includes a transistor (24 or 26) of a first type and a transistor (25 or 27) of a second type. The concentration of carriers in the conduction channel of the transistor (24) of the first type of one of the inverters (20) is different from the concentration of carriers in the conduction channel of the transistor (26) of the first type of the other inverter (21) so that the inverters have different threshold voltages.

15 Claims, 3 Drawing Sheets

PRE-WRITTEN VOLATILE MEMORY CELL

CROSS-REFERENCE TO RELATED APPLICATIONS

This application is based upon and claims priority from prior French Patent Application No. 04 11360, filed Oct. 25, 2004, the entire disclosure of which is herein incorporated by reference.

1. Field of the Invention

The present invention generally relates to static random access memories (SRAM) using MOS technology and more particularly to SRAMs for which an initialization value is pre-programmed.

2. Background of the Invention

As is known to those skilled in the art, SRAM memories generally employ cells comprising two inverters configured as a flip-flop for storing one data bit. When such an SRAM memory cell is powered up, the cell randomly adopts either the value 0 or the value 1. In order to use these SRAM memory cells, a data write operation must be performed prior to reading this data. Similarly, when the power supply is interrupted, any data stored in the memory is permanently lost.

In addition to a random-access memory (RAM), if it is desired to store a program in a non-volatile fashion in a memory circuit, read-only memory cells (ROM), programmable ROM, or re-programmable ROM are needed. Indeed, since a conventional ROM memory is not writable, this cannot be used to store variables of a program. The access times for memories of the programmable or re-programmable ROM type are longer than for memories of the RAM type. This longer access time of programmable ROM is undesirable for use when speed of operation is important.

Another use of non-volatile memories is for storing specific information in circuits, in particular for identification purposes. In the case of a circuit serial number that is common to many circuits, it is possible to use ROM-type memory cells. On the other hand, when it is desired to have circuits identified individually, for example mobile telephone circuits, SIM cards or bank cards, it is necessary to make use of memories of the programmable ROM type. These memories of the programmable ROM type are programmed with the individual identification number of the circuit at the end of the fabrication process. One drawback of this type of use of programmable ROM, from a security point of view, is that persons with criminal intent can easily obtain unprogrammed circuits, or can reprogram reprogrammable circuits for fraudulent purposes.

In the European Patent Application EP-A-1 434 237, there is disclosed a non-volatile SRAM memory cell that comprises means for storing one datum indelibly. Such a memory cell can be permanently programmed once by causing an irreversible degradation of the gate oxide layers of at least some of the transistors. Despite this programming, it is possible to use this memory as a conventional RAM memory, since the datum stored indelibly can be read as the memory is powered up. This provides a fast-access volatile memory that still has a non-volatile memory capability. However, this cell lacks long-term reliability. Indeed, the overall wear on all the transistors of the cell reduces the effect produced by the premature wear on a part of the transistors. If this cell is used frequently for read and write operations, the overall wear of the cell tends to erase the contents of the memory cell. Accordingly, the information does not have a satisfactory reliability over time for some applications with intensive read and write operations. Moreover, this memory cell requires additional transistors, and this memory remains to be programmed at the end of the fabrication process.

According what is needed is a method and system to over come the problems, drawbacks and shortcoming encountered in the prior art and to provide a RAM with pre-programmed initialization value.

SUMMARY OF THE INVENTION

The present invention provides an SRAM memory cell capable of storing provides datum in a non-volatile fashion. The storage of the datum is effected by means of a difference in doping in at least one of the transistors of the cell. Thus, the pre-writing of the cell or cells of a circuit that comprises several cells is carried out during a technological fabrication phase, and not by programming at the end of the fabrication process.

A first aspect of the present invention is a memory cell comprising two inverters configured as a flip-flop for storing one bit. Each inverter comprises a transistor of a first type and a transistor of a second type. The concentration of carriers in the conduction channel of the transistor of the first type of one of the inverters is different from the concentration of carriers in the conduction channel of the transistor of the first type of the other inverter so that the inverters have different threshold voltages.

A second aspect of the present invention is an integrated circuit comprising cells according to the first aspect, and a circuit capable of delivering a 'soft-start' power supply voltage for the cells on power-up.

Preferably, the integrated circuit comprises control means for turning on or off the power supply circuit that supplies the cells, the control circuit being capable of only turning on the power supply circuit for reading the contents of the cells.

A further aspect of the present invention is an electronic memory circuit fabricated on a semiconductor chip. The circuit comprises a plurality of elementary storage cells. Each elementary cell can store one bit by means of two inverters configured as a flip-flop. At least one memory cell is an asymmetric storage cell having two inverters configured as a flip-flop. Each inverter comprises a transistor of a first type and a transistor of a second type. The concentration of carriers in the conduction channel of the transistor of the first type of one of the inverters is different from the concentration of carriers in the conduction channel of the transistor of the first type of the other inverter such that the inverters have different threshold voltages.

The foregoing and other features and advantages of the present invention will be apparent from the following more particular description of the preferred embodiments of the invention, as illustrated in the accompanying drawings.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention will be apparent from the following detailed description taken in conjunction with the accompanying drawings in which:

DESCRIPTION OF PREFERRED EMBODIMENTS

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

Figure 1:
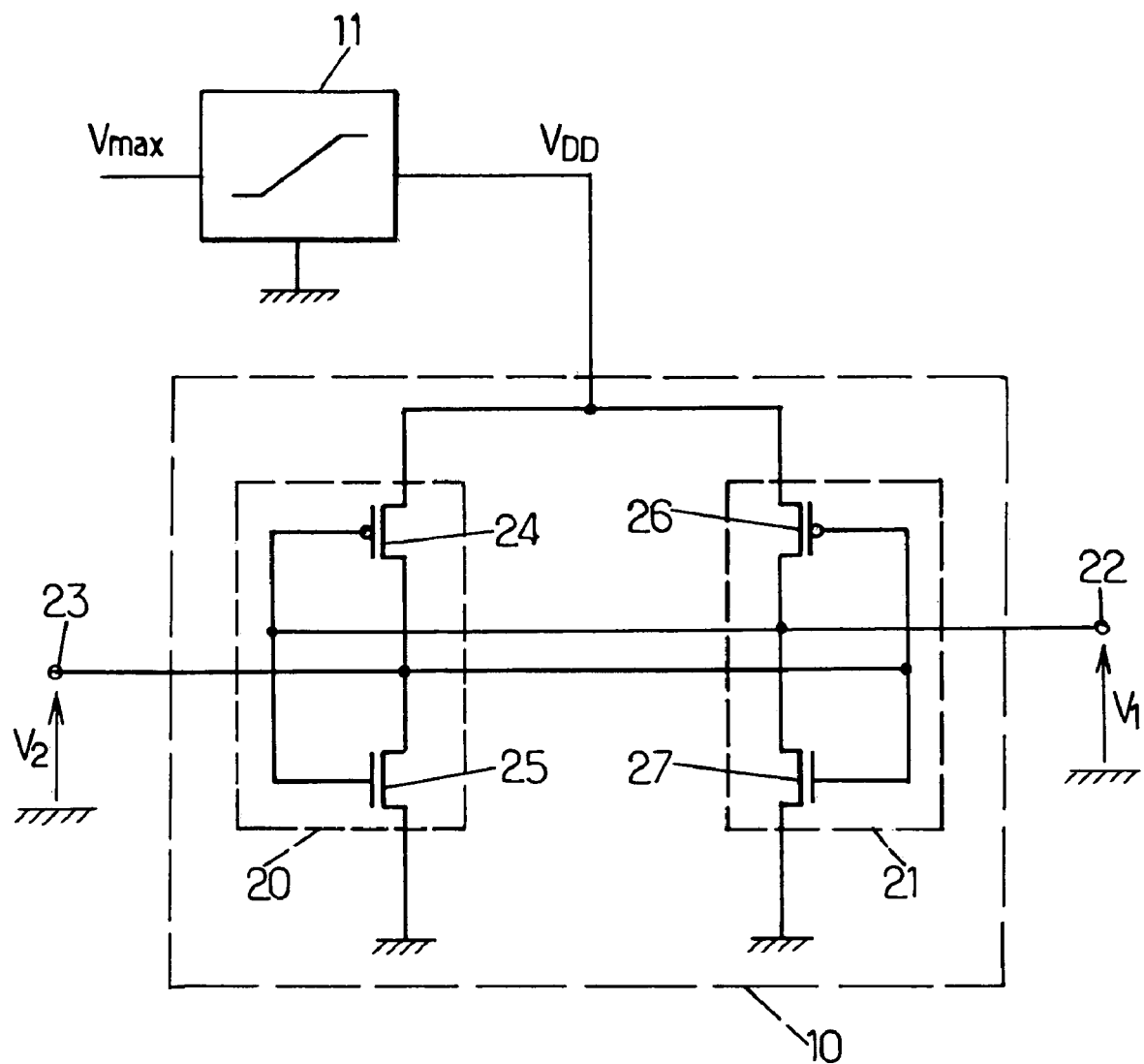
FIG. 1 is a schematic of an exemplary of memory cell according to the present invention.

FIG. 1 is a schematics of a memory cell 10 of the SRAM type. This memory cell 10 is supplied by a power supply circuit 11. The purpose of the power supply circuit 11 is to provide a progressive or "soft start" or increasing ramp during start-up of the power supply voltage $V_{DD}$ of the cell.

The memory cell 10 comprises two inverters 20 and 21 configured as a flip-flop, that is to say such that each inverter has its output connected to the input of the other inverter. The output of the inverter 21 corresponds to an output terminal 22 of the memory cell 10, where a voltage V1 can be read. The output of the inverter 20 corresponds to an output terminal 23 of the memory cell 10, where a voltage V2 can be read. In one embodiment, the inverter 20 comprises a p-MOS transistor 24 and an n-MOS transistor 25. The drains of the transistors 24 and 25 are connected together to form the output of the inverter 20. The gates of the transistors 24 and 25 are connected together to form the input of the inverter 20 that is connected to the output of the inverter 21. The source of the transistor 25 is connected to ground whereas the source of the transistor 24 receives the power supply voltage $V_{DD}$ for the memory cell 10. The inverter 21 comprises a p-MOS transistor 26 and an n-MOS transistor 27. The drains of the transistors 26 and 27 are connected together and form the output of the inverter 21. The gates of the transistors 26 and 27 are connected together and form the input of the inverter 21 that is connected to the output of the inverter 20. The source of the transistor 27 is connected to ground whereas the source of the transistor 26 receives the power supply voltage for the memory cell 10.

The output terminals of the inverters 22 and 23 are connected, depending on the type of application, either directly to read amplifiers or to bit lines via link transistors, one bit line being common to a plurality of memory cells. Furthermore, the bit lines are connected, on the one hand, to read amplifiers and, on the other, to write amplifiers.

In a known manner to those of average skill in the art, when the input voltage of an inverter is at a low level, the p-MOS transistor conducts and pulls the output up to a high level. In a reciprocal manner, when the input voltage is at a high level, the n-MOS transistor conducts and pulls the output voltage down to a low level. In a transient mode, the input voltage goes from a high level to a low level or goes from a low level to a high level. During this transition, the inverter output will switch over when the voltage has reached a threshold voltage of the inverter. The threshold voltage of the inverter corresponds to a mean of the intrinsic threshold voltages of the two transistors forming the inverter. Conventionally, the threshold voltages of each transistor are approximately the same, in absolute value, and the threshold voltage of the inverter corresponds to about half the power supply voltage.

When the power supply voltage is turned on, the power supply voltage itself exhibits a transition. The input voltages of the.inverters are determined by the ratio of the capacitances of the gates of the inverter transistors which conventionally corresponds to around half the power supply voltage. When this power supply voltage exceeds twice a conduction threshold voltage of the n-MOS transistor, which is generally lower, in absolute value, than the threshold voltage of the p-MOS transistor, the inverter starts to switch hard over and its output is then positioned in a low state.

In the case of a conventional memory cell that comprises two substantially identical inverters, the input voltages of the two inverters correspond to half the power supply voltage as long as one of the inverters has not switched over; the memory cell adopts its final state when the first of the two inverters starts to switch over to write a low level on its output, which then automatically causes the other inverter to switch over to a high level. However, the determination of the inverter that is first to switch over is completely random, since it depends on minute differences associated with the fabrication process or on parasitic phenomena.

The principal implemented in the invention consists in having, in a given cell, two inverters that are asymmetric such that their threshold voltages are different. The asymmetry is obtained by carrying out an additional fabrication step on only one of the transistors of the cell. Thus, the conduction channel of one of the transistors will be either depleted or enhanced. According to one particular embodiment, a power supply circuit 11 generates a gentle power supply voltage ramp at power-up in order to ensure a slow switch-over of the two cells. Indeed, if the voltage varies too abruptly, the phenomenon is more difficult to control. However, for a large memory, that is to say comprising a large number of memory cells, the equivalent capacitance corresponding to the matrix of cells is large enough to cause a slow rise of the power supply voltage at power-up and the circuit 11 is not required.

Several fabrication processes are possible depending on the application of this type of cell. In the case of a memory of the static RAM type for which it is desired to have a reset to zero of all the memory cells, or for which it is desired to globally write a pre-recorded program or a common serial number for a large number of memory cells, a fabrication mask can be produced for "over-doping" or "under-doping" one of the transistors relative to the other. Thus, one of the transistors, for example the transistor 24, will be subject to a depletion step that consists in performing an additional implantation on its channel with p-dopant, thus reducing the number of n carriers initially present in its channel and thus lowering its threshold voltage.

According to another embodiment, in which the memory cell is designed to store a unique code for each circuit, it is not possible to use a mask. However, the depletion step is still carried out, but in a selective manner. In order to carry out the implantation selectively, prior to the step for the implantation of the depletion dopant, a photosensitive layer is deposited that will be selectively insulated using an electron beam (e-BEAM) or by means of a laser. The photosensitive layer is subsequently developed then the implantation is performed.

The selective implantation is done during the fabrication process. The cells are programmed in a definitive manner and cannot be reprogrammed.

According to another embodiment, instead of performing a depletion, a channel enhancement is carried out. The channel enhancement is also effected by ion implantation of dopant of the same type as the channel's original dopant.

Whereas the depletion has the effect of lowering the conduction threshold of the depleted transistor, the enhancement has the effect of raising the conduction threshold of the enhanced transistor. It is preferable to perform a depletion since the lowering of the threshold voltage allows a reaction with a lower power supply voltage than for a raised threshold.

Figure 2:
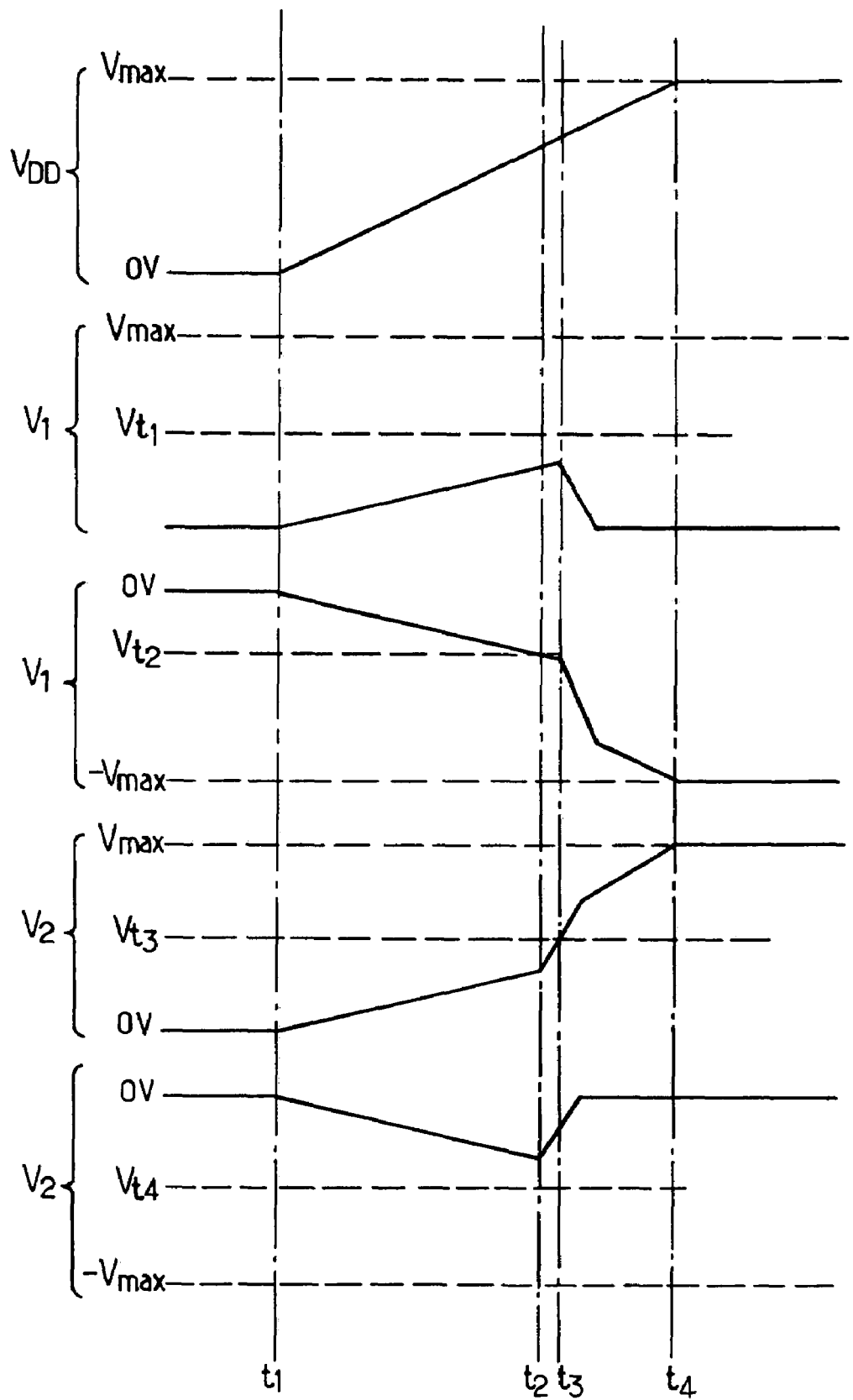
FIG. 2 shows operational curves of the present invention when applied to the circuit of FIG. 1 according to a first embodiment.

It will now be explained how the invention works according to a first embodiment corresponding to a memory cell where all the transistors are the same size and/or the p-MOS transistor 24 is depleted. In this embodiment, the power supply voltage is considered to be higher than twice the threshold voltage in absolute value, whatever this voltage level. FIG. 2 illustrates the timing diagrams of the various voltages involved, when applied to FIG. 1.

The voltage $V_{DD}$ corresponds to the power supply voltage of the memory cell 10. This power supply voltage starts at 0 volts and exhibits a transition to arrive at a voltage $V_{max}$ corresponding to the power supply voltage. This transition is shown with an exaggerated slope so that the operation can be more readily explained. The voltage V1 shown in FIG. 2 corresponds to the output voltage of the inverter 21 but also to the gate/source voltage of transistor 25. In the timing diagram, a voltage level $V_{T1}$ is shown that corresponds to the threshold voltage of the n-MOS transistor 25. This threshold voltage 21 is just below half the power supply maximum voltage $V_{max}$.

Figure 3:
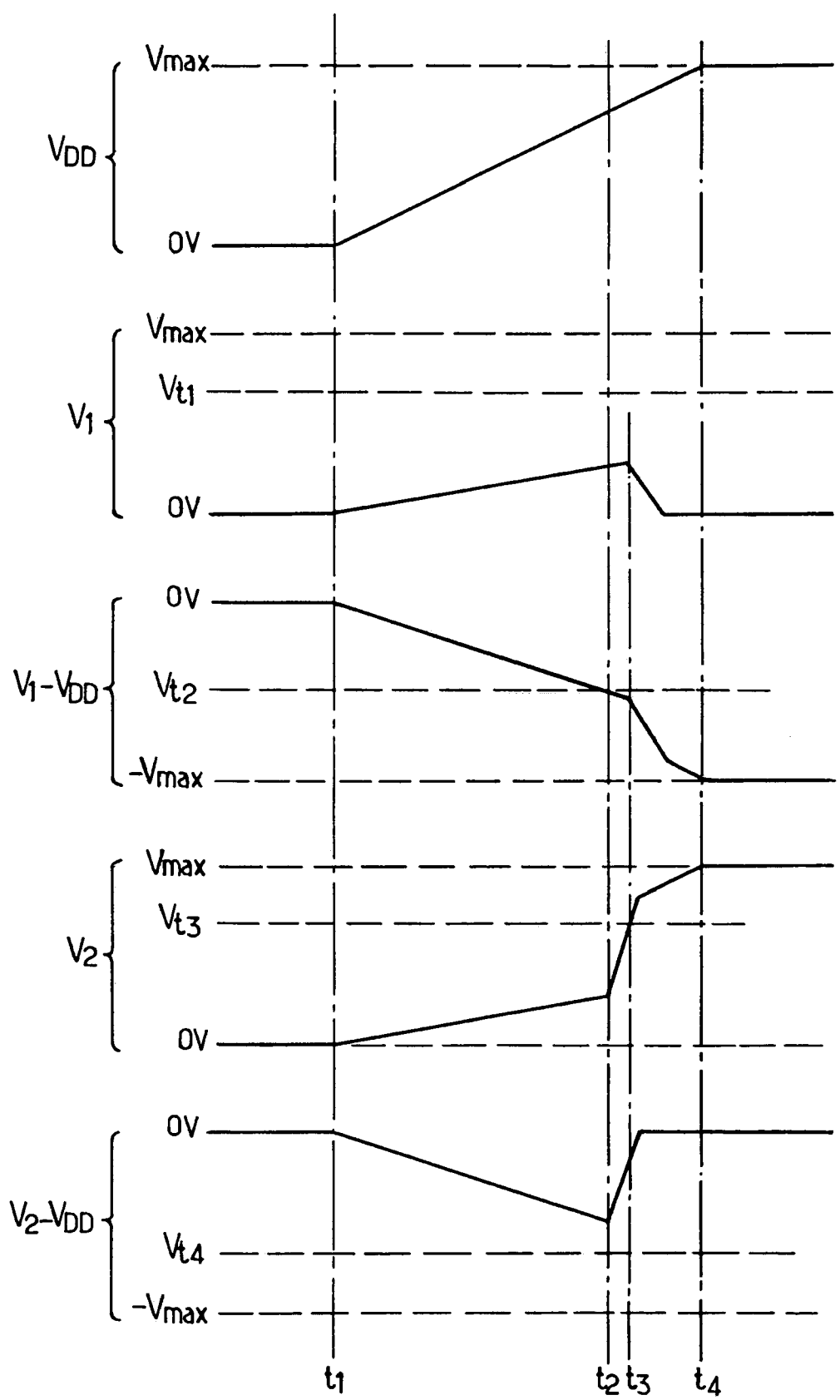
FIG. 3 shows operational curves of the present invention when applied to the circuit of FIG. 1, according to a second embodiment.

The voltage V1-$V_{DD}$ shown in the FIG. 3 corresponds to the gate/source voltage of the transistor 24 on which the threshold voltage $V_{T2}$ is shown which is well below half the power supply maximum voltage since this transistor is depleted. It should be noted that this voltage is negative since the transistor is of the p-MOS type.

The voltage V2 corresponds to the output voltage of the inverter 20 and to the input voltage of the inverter 21. This voltage V2 also corresponds to the gate/source voltage of the transistor 27, the voltage $V_{T3}$ corresponding to its threshold voltage.

The voltage V1-$V_{DD}$ corresponds to the gate/source voltage of the transistor 26 on which the threshold voltage $V_{T4}$, corresponding to transistor 26, is shown.

As previously indicated, the voltages $V_{T1}$, $V_{T3}$ and $V_{T4}$ are practically equal in absolute value. Strictly speaking, the voltage $V_{T4}$ is slightly higher in absolute value than the voltages $V_{T1}$ and $V_{T3}$. On the other hand, the voltage $V_{T2}$ is much lower, in absolute value, than all the other threshold voltages $V_{T1}$, $V_{T3}$ and $V_{T4}$.

As previously indicated, this is a standard memory cell where the transistors are of the same size. At power-up, the memory cell is in an indeterminate state with all the transistors turned off. The input voltage of each of the inverters corresponds to a voltage defined by a voltage divider capacitive bridge that corresponds to the equivalent capacitances between the gate and the substrate of the transistors forming the cell. Since the transistors 24 to 27 have the same dimensions in terms of channel length and width, the capacitive bridge formed by each inverter allows the gate voltage to be equal to half the power supply voltage as long as no transistor has been turned on. Thus, when the power supply voltage $V_{DD}$ starts to rise with a slow ramp at time t1, the voltages V1 and V2 start to rise but with half the slope relative to the slope of the power supply voltage $V_{DD}$ and, in a reciprocal manner, the voltages V1-$V_{DD}$ and V2-$V_{DD}$ decrease with a slope that is half the slope of the power supply voltage $V_{DD}$. At time t2, the voltage V1-$V_{DD}$ reaches the threshold voltage $V_{T2}$ of the transistor 24. The transistor 24 then starts to conduct and the voltage V2 tends rapidly towards the power supply voltage $V_{DD}$. The switching of the transistor 24 causes a faster slope than that of the rise of the power supply voltage and, at time t3, the voltage V2 reaches the threshold voltage $V_{T3}$ of the transistor 27. This transistor 27 then starts to conduct which brings the voltage V1 back to ground potential (0 volts).

Since the conduction of the transistor 24 brings the voltage V2 back to the power supply voltage, this also brings the voltage V2-$V_{DD}$ back to zero volts. Thus, the transistor 26 still remains off. The conduction of the transistor 27 causes the voltage V1 to return to zero thus keeping the transistor 25 turned off. This behavior of the voltage V1 brings the voltage V1-$V_{DD}$ back to a voltage close to $V_{DD}$ which keeps the transistor 24 conducting. The voltage $V_{DD}$ continues to establish itself until it reaches a voltage $V_{max}$ and the cell is positioned in a state that is pre-defined by the depletion of the transistor 24.

It should be noted that the level 0 or 1 of a cell is defined in an arbitrary manner according to whether it is decided that the level 1 corresponds to a high voltage for V1 and to a low voltage for V2 or vice versa. Programming a cell will, in the example described, consist in depleting either the transistor 24 or the transistor 26 depending on the desired pre-written state, 0 or 1.

It should be noted that the example considers a depleted p-MOS transistor for the cell, but an n-MOS transistor could have been depleted instead. Similarly, an enhancement could also have been considered rather than a depletion. As an extreme example, the thresholds of the four transistors of the cell could have been acted on, one inverter having a depleted p-MOS transistor and an enhanced n-MOS transistor, and the other inverter having an enhanced p-MOS transistor and a depleted n-MOS transistor. However, in order to reduce the fabrication costs, it is preferable to use only one of the two techniques (depletion or enhancement). Moreover, in order for the operation to be substantially the same as a conventional SRAM cell, it is preferable to only modify one of the inverters.

In the example that has just been described, the power supply maximum voltage $V_{max}$ was considered to be at least twice as high, in absolute value, as a threshold voltage. Currently, the technology is evolving towards the use of lower and lower power supply voltages. This evolution of the technology means that the threshold voltages of the transistors are tending to be higher than half the power supply voltage in absolute value. In such a case, it is necessary to resort to a strong depletion or a strong enhancement in order to obtain the desired effect. However, according to another embodiment, resorting to too large a depletion can be avoided by making use of a different gate surface area sizing between the n-MOS transistors and the p-MOS transistors. By way of example, over-sizing the gate capacitances of the transistors opposing the depleted transistor allows the threshold voltage of the depleted transistor to be reached more rapidly. FIG. 3 corresponds to an embodiment where the threshold voltages $V_{T1}$, $V_{T3}$ and $V_{T4}$ are, in absolute value, for example equal to two thirds of the power supply maximum voltage $V_{max}$. The transistor 24 is still a depleted transistor but with a threshold voltage brought, for example, back to around $V_{max}/2$. In order to be sure of arriving at this threshold voltage $V_{T2}$, the n-MOS transistors 25 and 27 are dimensioned, in terms of gate surface area, with respect to the p-MOS transistors 24 and 26, such that the capacitance ratio created by the equivalent gate capacitance bridge between the p-MOS transistor and the n-MOS transistor of each inverter causes, at power-up, a voltage divider bridge that brings the input voltage V1 or V2 of each of the inverters 20 and 21 back to a voltage equal to one third of the power supply voltage $V_{DD}$.

Thus the voltages V1 and V2 follow a slope equal to one third of the slope of the voltage $V_{DD}$ as long as these are not controlled by the conduction of one of the transistors 24 to 27. Conversely, the gate/source voltages of the p-MOS transistors 24 and 25 follow a slope equal to two thirds of the slope of the voltage $V_{DD}$. Thus, at a time t2, the voltage V1-$V_{pp}$ can arrive at a voltage equal to the voltage $V_{T2}$, even though this is equal to half the threshold voltage, and can cause the same phenomenon of successive conduction of the transistor 24 followed by the transistor 27.

It should be noted that, even if it is not possible to reach the threshold voltage of the transistors at power-up, the positioning of the cell 10 at the desired level is achieved. By way of example, if the transistors have the same gate surface area with threshold voltages higher than half the power supply maximum voltage $V_{MAX}$, these will remain turned off after the establishment of the power supply voltage. However, even when turned off, the transistors allow a leakage current to flow. The gates of an inverter are therefore charged up or discharged by the difference in the leakage currents existing between the n-MOS transistor and the p-MOS transistor of the other inverter. In the case where the inverters are asymmetric, the one which has a threshold voltage further from $V_{MAX}/2$ will drive the gate voltage of the other inverter that will become unbalanced and will consequently amplify the switch over.

One advantage of such a cell 10 is also to allow a circuit to have a secret identification. Indeed, it is only possible to access non-volatile information after power-up and before performing a write operation of this information. The non-volatile contents can therefore be erased after having used them while, at the same time, retaining them in a hidden form.

The secrecy can be increased, in certain cases, by interrupting the power supply to the cells. Such a use allows a circuit to store a secret identification number and prevents it from being accessed unless the cells are powered up in order to read it. The power supply of the cells can therefore be conditional, a fact which reinforces the confidential nature of their contents. For this purpose, control means can be provided for turning on or off the power supply circuit that supplies power to the memory cells only for reading the contents of the cells. Stated differently, a control circuit is used for turning on or off a power supply voltage to the cells. In one embodiment, the control circuit is capable of selectively controlling the power supply voltage to those cells whose contents are to be read. This control circuit reduces unauthorized reading of cell contents.

Moreover, if a person with criminal intent wants to obtain the non-volatile information from the cells by a reverse engineering technique, it will be necessary for him to perform a doping analysis for all the storage transistors, an operation that is highly complex. In order to complicate the reverse engineering analysis, the memory cells may be dispersed amongst the logic circuits forming the integrated circuit where they are located.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips.

The resulting integrated circuit chips can be distributed by the fabricator in raw wafer form (that is, as a single wafer that has multiple unpackaged chips), as a bare the, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A memory cell comprising:
   two inverters configured as a flip-flop for storing one bit, each of the two inverters comprising a transistor of a first type and a transistor of a second type, characterized in that a concentration of carriers in a conduction channel of the transistor of the first type of a first of the two inverters is different from a concentration of carriers in a conduction channel of the transistor of the first type of a second of the inverters so that the inverters have different threshold voltages, wherein at least one of the transistor of the first type has a different channel surface area from a channel surface area of at least one transistor of the second type.

2. The memory cell according to claim 1, wherein only one of the transistor of the first type in each of the two inverters is a depleted transistor.

3. The memory cell according to claim 1, wherein each transistor of the first type is a p-MOS transistor, and wherein each transistor of the second type is an n-MOS transistor.

4. The memory cell according to claim 2, wherein each transistor of the first type is a p-MOS transistor, and wherein each transistor of the second type is an n-MOS transistor.

5. An integrated circuit comprising:
   a plurality of memory cells, with at least one of the memory cells including two inverters configured as a flip-flop for storing one bit, each of the two inverters comprising a transistor of a first type and a transistor of a second type, characterized in that a concentration of carriers in a conduction channel of the transistor of the first type of a first of the two inverters is different from a concentration of carriers in a conduction channel of the transistor of the first type of a second of the two inverters so that the inverters have different threshold voltages; and a circuit capable of delivering a progressive power supply voltage for the cells at power-up;

wherein at least one of the transistors of the first type has a different channel surface area from a channel surface area of at least one transistor of the second type.

6. The integrated circuit according to claim 5, further comprising:

a control circuit for turning on or off a power supply voltage to the cells, wherein the control circuit is capable of selectively controlling the power supply voltage to those cells whose contents are to be read.

7. The integrated circuit according to claim 5, wherein the cells are dispersed among logic circuits forming an integrated circuit.

8. The integrated circuit according to claim 6, wherein the cells are dispersed among logic circuits forming an integrated circuit.

9. An electronic memory circuit fabricated on a semiconductor chip, the circuit comprising:

a plurality of elementary storage cells, each elementary cell being able to store one bit by means of two inverters configured as a flip-flop, and further comprising at least one asymmetric storage cell having two inverters configured as a flip-flop, wherein each of the two inverters comprise a transistor of a first type and a transistor of a second type, a concentration of carriers in a conduction channel of the transistor of the first type of a first of the two inverters being different from a concentration of carriers in a conduction channel of the transistor of the first type of a second of the two inverters so that the inverters have different threshold voltages, wherein at least one of the transistors of the first type has a different channel surface area from a channel surface area of at least one transistor of the second type.

10. The memory circuit according to claim 9, wherein, for each asymmetric cell, only one transistor of the two inverters of the first type is a depleted transistor.

11. The memory circuit according to claim 9, wherein each transistor of the first type is a p-MOS transistor, and wherein each transistor of the second type is an n-MOS transistor.

12. The memory circuit according to claim 10, wherein each transistor of the first type is a p-MOS transistor, and wherein each transistor of the second type is an n-MOS transistor.

13. The integrated circuit according to claim 1, wherein the at least one of the transistor of the first type has the different channel surface area from the channel surface area of the at least one transistor of the second type so to limit an amount of depletion or enrichment necessary for circuit applications where a threshold voltage of the transistor of the first inventor or the transistor of the second type is higher than one-half an absolute value of a supply voltage.

14. The integrated circuit according to claim 5, wherein the at least one of the transistor of the first type has the different channel surface area from the channel surface area of the at least one transistor of the second type so to limit an amount of depletion or enrichment necessary for circuit applications where a threshold voltage of the transistor of the first inventor or the transistor of the second type is higher than one-half an absolute value of a supply voltage.

15. The memory circuit according to claim 9, wherein the at least one of the transistor of the first type has the different channel surface area from the channel surface area of the at least one transistor of the second type so to limit an amount of depletion or enrichment necessary for circuit applications where a threshold voltage of the transistor of the first inventor or the transistor of the second type is higher than one-half an absolute value of a supply voltage.

* * * * *